US009625136B2

(12) United States Patent
Hino et al.

(10) Patent No.: US 9,625,136 B2
(45) Date of Patent: Apr. 18, 2017

(54) LIGHT-EMITTING DEVICE (71) Applicant: Toshiba Lighting & Technology Corporation, Yokosuka-shi, Kanagawa-ken (JP)

(72) Inventors: Kiyokazu Hino, Yokosuka (JP); Takahiro Kurihara, Yokosuka (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 54 days.

(21) Appl. No.: 14/436,261

(22) PCT Filed: Sep. 3, 2013

(86) PCT No.: PCT/JP2013/073689
§ 371 (c)(1),
(2) Date: Apr. 16, 2015

(87) PCT Pub. No.: WO2014/065009
PCT Pub. Date: May 1, 2014

(65) Prior Publication Data
US 2015/0247629 A1    Sep. 3, 2015

(30) Foreign Application Priority Data
Oct. 26, 2012    (JP) .................. 2012-237204

(51) Int. Cl.
*F21V 23/00*    (2015.01)
*F21V 19/00*    (2006.01)
(Continued)

(52) U.S. Cl.
CPC ........ *F21V 23/002* (2013.01); *F21V 19/0025* (2013.01); *F21V 23/06* (2013.01);
(Continued)

(58) Field of Classification Search
CPC .. F21V 19/0025; F21V 23/002; H05K 3/3447
See application file for complete search history.

(56) References Cited

U.S. PATENT DOCUMENTS 5,281,770 A    1/1994 Kamei et al.

FOREIGN PATENT DOCUMENTS

EP    0459831 A2    12/1991
GB    854593 A    11/1960
(Continued)

OTHER PUBLICATIONS

Nov. 19, 2013—International Search Report—Intl App PCT/JP2013/073689.
(Continued)

*Primary Examiner* — Elmito Breval
(74) *Attorney, Agent, or Firm* — Banner & Witcoff, Ltd.

(57) ABSTRACT

A light emitting device according to the present embodiment includes a substrate on which a wiring portion is provided; a light emitting element which is provided on the substrate and is electrically connected to the wiring portion; a feeding portion to which an electric power is supplied from the outside; a first connection portion which is provided on the substrate and is electrically connected to the wiring portion; a second connection portion which is joined to the first connection portion through soldering and includes a first opening portion into which the feeding portion is inserted; and a soldering portion which is provided between the first opening portion and the feeding portion.

6 Claims, 8 Drawing Sheets (51) Int. Cl.
    *H01R 43/02*     (2006.01)
    *F21V 23/06*     (2006.01)
    *H05K 3/34*     (2006.01)
    *H01R 12/58*     (2011.01)
    *F21V 29/70*     (2015.01)
    *H05K 3/30*     (2006.01)
    *F21S 8/10*     (2006.01)
    *F21Y 101/00*     (2016.01)
    *F21Y 105/00*     (2016.01)
    *F21Y 115/30*     (2016.01)
    *F21Y 115/15*     (2016.01)

(52) U.S. Cl.
    CPC ....... *H01R 43/0256* (2013.01); *H05K 3/3447* (2013.01); *F21S 48/212* (2013.01); *F21S 48/232* (2013.01); *F21S 48/33* (2013.01); *F21V 19/003* (2013.01); *F21V 19/005* (2013.01); *F21V 19/0055* (2013.01); *F21V 29/70* (2015.01); *F21Y 2101/00* (2013.01); *F21Y 2105/00* (2013.01); *F21Y 2115/15* (2016.08); *F21Y 2115/30* (2016.08); *H01R 12/58* (2013.01); *H05K 3/306* (2013.01); *H05K 2201/1025* (2013.01); *H05K 2201/1031* (2013.01); *H05K 2201/10106* (2013.01); *H05K 2201/10401* (2013.01); *Y02P 70/611* (2015.11)

(56) References Cited

FOREIGN PATENT DOCUMENTS

| | | |
|---|---|---|
| JP | S63-038364 U | 3/1988 |
| JP | S64-064288 A | 3/1989 |
| JP | 2002-124761 A | 4/2002 |
| JP | 2011-253622 A | 12/2011 |
| JP | 2011253622 A * | 12/2011 |

OTHER PUBLICATIONS

Jun. 9, 2016—(EP) Extended Search Report—App 13849558.5.
Wandt, H et al., "Self-Locating and Reinforced Solder Joint", Motorola Technical Developments, Motorola Inc, Schaumburg, IL, vol. 13, Jul. 1, 1991, p. 112, XP000259248, ISSN: 0887-5286.
Apr. 28, 2015—(WO) International Preliminary Report on Patentability—Intl App PCT/JP2013/073689.
Nov. 19, 2013—(WO) Written Opinion of ISA—Intl App PCTJP2013073689.

* cited by examiner

LIGHT-EMITTING DEVICE

TECHNICAL FIELD

Embodiments described below are generally related to a light emitting device.

BACKGROUND ART

There is a light emitting device on which a light emitting element such as a light emitting diode (LED) is provided. This light emitting device is provided with a connection portion for performing an electrical connection between a wiring pattern which is provided on a substrate and a feeding portion to which an electric power is supplied from the outside. Then, generally, the wiring pattern is joined to the feeding portion through soldering in the connection portion.

For this reason, improvement of reliability of soldering in the connection portion which joins the feeding portion is required.

CITATION LIST

Patent Literature

PTL 1: JP-A-2002-124761

SUMMARY OF INVENTION

Technical Problem

An object of the present invention is to provide a light emitting device capable of improving reliability of soldering in a connection portion which joins a feeding portion.

Solution to Problem

A light emitting device according to the present embodiment includes a substrate on which a wiring portion is provided, a light emitting element which is provided on the substrate and is electrically connected to the wiring portion, a feeding portion to which an electric power is supplied from the outside, a first connection portion which is provided on the substrate and is electrically connected to the wiring portion, a second connection portion which is joined to the first connection portion through soldering and includes a first opening portion into which the feeding portion is inserted, and a soldering portion which is provided between the first opening portion and the feeding portion.

Advantageous Effects of Invention

According to the embodiment of the invention, it is possible to provide a light emitting device capable of improving a reliability of soldering in a connection portion which joins a feeding portion.

BRIEF DESCRIPTION OF DRAWINGS

FIGS. 4A to 4C are diagrams schematically illustrating a configuration of an opening portion 6a.

DESCRIPTION OF EMBODIMENTS

A first invention relates to a light emitting device including a substrate on which a wiring portion is provided; a light emitting element which is provided on the substrate and is electrically connected to the wiring portion; a feeding portion to which an electric power is supplied from the outside; a first connection portion which is provided on the substrate and is electrically connected to the wiring portion; a second connection portion which is joined to the first connection portion through soldering and includes a first opening portion into which the feeding portion is inserted; and a soldering portion which is provided between the first opening portion and the feeding portion.

According to the light emitting device, it is possible to shorten the distance between the second connection portion and the feeding portion. For this reason, when joining the second connection portion and the feeding portion through soldering, the solder is likely to spread to the second connection portion and the feeding portion, and thus a normal fillet is easily formed. As a result, the strength and reliability in a soldering portion can be improved.

A second invention relates to the light emitting device according to the first invention in which the first connection portion has a second opening portion, and the first opening portion is smaller than the second opening portion.

According to the light emitting device, it is possible to shorten the distance between the second connection portion and the feeding portion. For this reason, when joining the second connection portion and the feeding portion through the soldering, the solder is likely to spread to the second connection portion and the feeding portion, and thus a normal fillet is easily formed. As a result, the strength and reliability in a soldering portion can be improved.

A third invention relates to the light emitting device according to the first invention in which the second connection portion includes a first base portion and a projection portion which projects toward the substrate from the first base portion, and the first opening portion passes through the first base portion and the projection portion in the thickness direction.

According to the light emitting device, when joining the first connection portion and the second connection portion through the soldering, it is possible to suppress a deviation of a positional relationship therebetween.

A fourth invention relates to the light emitting device according to the third invention in which the projection portion is inserted into a hole which is provided in the substrate.

According to the light emitting device, since it is possible to join the first connection portion and the second connection portion through the soldering in a state where the projection portion is inserted into the inside of the hole of the substrate, the positional relationship between the first connection portion and the second connection portion is not deviated even when the solder is melted. For this reason, it is possible to make the state of the soldering portion stable.

A fifth invention relates to the light emitting device according to the first invention in which the second connection portion includes a first base portion, a projection portion which projects toward the substrate from the first base portion, and a second base portion which is provided on the projection portion on the side opposite to the side on which the first base portion is provided, the second base portion projects toward the outside of the second connection portion, and the first opening portion passes through the first base portion in the thickness direction.

According to the light emitting device, it is possible to elongate the distance between a position where the feeding portion is joined through soldering and the substrate. For this reason, when joining the feeding portion through the soldering, it is possible to suppress heat dissipation to the substrate. Accordingly, it is possible to realize facilitation of solder-joint, and reduction of an influence of the mounted light emitting element.

A sixth invention relates to the light emitting device according to the first invention, in which the second connection portion includes a first base portion, a projection portion which projects toward the substrate from the first base portion, and a second base portion which is provided on the projection portion on the side opposite to the side on which the first base portion is provided, the second base portion projects toward the inside of the second connection portion, and the first opening portion passes through the first base portion in the thickness direction.

According to the light emitting device, it is possible to elongate the distance between a position where the feeding portion is joined through soldering and the substrate. For this reason, when joining the feeding portion through the soldering, it is possible to suppress heat dissipation to the substrate. Accordingly, it is possible to realize facilitation of the solder-joint, reduction of an influence of the mounted light emitting element.

Furthermore, the second base portion projects toward the inside of the second connection portion, and thus it is possible to realize the reduction in size of the second connection portion. In addition, it is possible to make a mounted area in the substrate small due to the reduction in size of the second connection portion, and therefore, it is possible to realize the reduction in size of the light emitting device.

A seventh invention relates to a light emitting device including a substrate on which a wiring portion is provided; a light emitting element which is provided on the substrate and is electrically connected to the wiring portion; a first connection portion which is provided on the substrate and is electrically connected to the wiring portion; and a second connection portion which is joined to the first connection portion through the soldering and includes a first opening portion into which the feeding portion to which an electric power is supplied from the outside is inserted.

According to the light emitting device, it is possible to shorten the distance between the second connection portion and the feeding portion. For this reason, when joining the second connection portion and the feeding portion through the soldering, the solder is likely to spread to the second connection portion and the feeding portion, and thus a normal fillet is easily formed. As a result, the strength and reliability in a soldering portion can be improved.

An eighth invention relates to the light emitting device according to the seventh invention in which the first connection portion includes a second opening portion, and the first opening portion is smaller than the second opening portion.

According to the light emitting device, it is possible to shorten the distance between the second connection portion and the feeding portion. For this reason, when joining the second connection portion and the feeding portion through the soldering, the solder is likely to spread to the second connection portion and the feeding portion, and thus a normal fillet is easily formed. As a result, the strength and reliability in a soldering portion can be improved.

A ninth invention relates to the light emitting device according to the seventh invention in which the second connection portion includes a first base portion and a projection portion which projects toward the substrate from the first base portion, and the first opening portion passes through the first base portion and the projection portion in the thickness direction.

According to the light emitting device, when joining the first connection portion and the second connection portion through the soldering, it is possible to suppress the deviation of a positional relationship therebetween.

A tenth invention relates to the light emitting device according to the ninth invention in which the projection portion is inserted into a hole which is provided in the substrate.

According to the light emitting device, since it is possible to join the first connection portion and the second connection portion through the soldering in a state where the projection portion is inserted into the inside of the hole of the substrate, the positional relationship between the first connection portion and the second connection portion is not deviated even when the solder is melted. For this reason, it is possible to make the state of the soldering portion stable.

An eleventh invention relates to the light emitting device according to the seventh invention in which the second connection portion includes a first base portion, a projection portion which projects toward the substrate from the first base portion, and a second base portion which is provided on the projection portion on the side opposite to the side on which the first base portion is provided, the second base portion projects toward the outside of the second connection portion, and the first opening portion passes through the first base portion in the thickness direction.

According to the light emitting device, it is possible to elongate the distance between a position where the feeding portion is joined through soldering and the substrate. For this reason, when joining the feeding portion through the soldering, it is possible to suppress heat dissipation to the substrate. Accordingly, it is possible to realize facilitation of the solder-joint, reduction of an influence of the mounted light emitting element.

A twelfth invention relates to the light emitting device according to the seventh invention in which the second connection portion includes a first base portion, a projection portion which projects toward the substrate from the first base portion, and a second base portion which is provided on the projection portion on the side opposite to the side on which the first base portion is provided, the second base portion projects toward the inside of the second connection portion, and the first opening portion passes through the first base portion in the thickness direction.

According to the light emitting device, it is possible to elongate the distance between a position where the feeding portion is joined through soldering and the substrate. For this reason, when joining the feeding portion through the soldering, it is possible to suppress heat dissipation to the substrate. Accordingly, it is possible to realize facilitation of the solder-joint, reduction of an influence of the mounted light emitting element.

Furthermore, the second base portion projects toward the inside of the second connection portion, and thus it is possible to realize the reduction in size of the second connection portion. In addition, it is possible to make a mounted area in the substrate small due to the reduction in size of the second connection portion, and therefore, it is possible to realize the reduction in size of the light emitting device.

Hereinafter, description will be given of the embodiment with reference to drawings. In addition, like reference numerals are given to like elements in the drawings and description thereof is properly omitted.

Figure 1A:
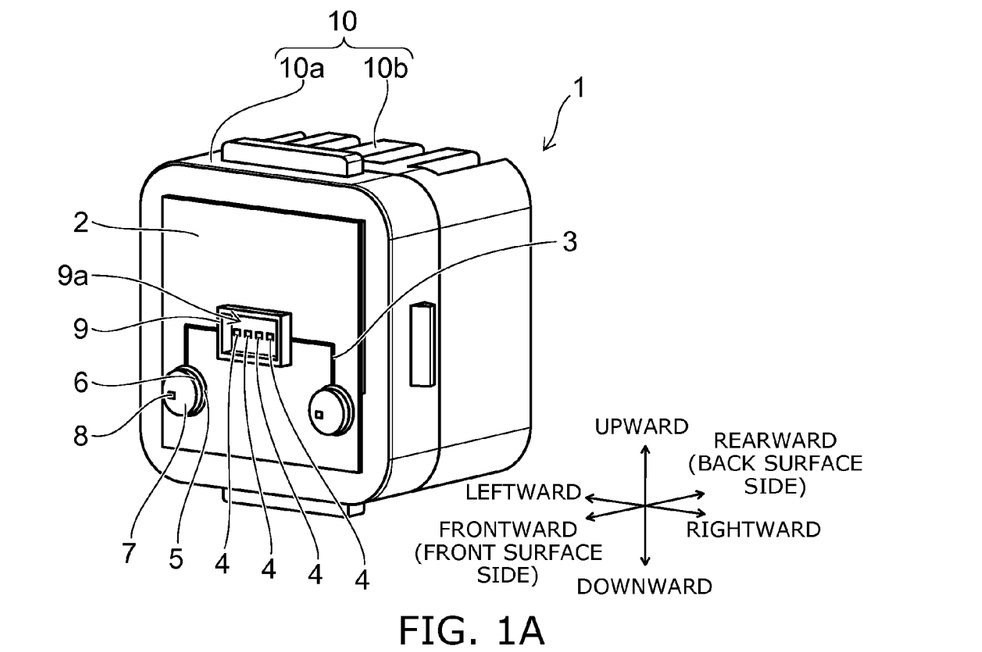
FIGS. 1A and 1B are diagrams schematically illustrating a light emitting device 1 according to the present embodiment.
Figure 1B:
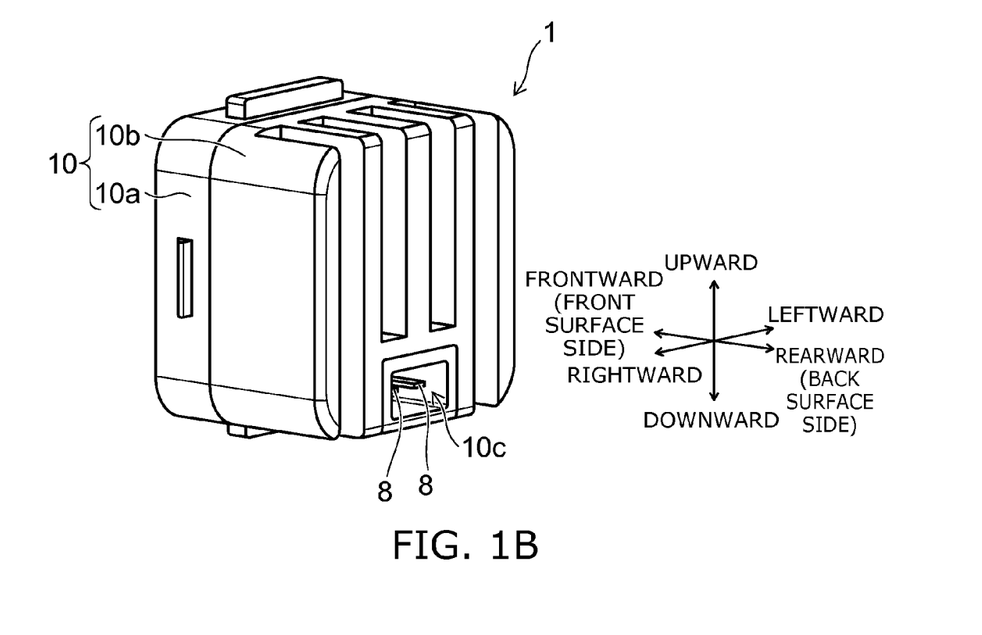

FIG. 1 is a diagram schematically illustrating a light emitting device 1 according to the present embodiment.

Meanwhile, FIG. 1A is a schematic perspective view when viewing the light emitting device 1 from the front side, and FIG. 1B is a schematic perspective view when viewing the light emitting device 1 from the rear side.

As illustrated in FIGS. 1A and 1B, the light emitting device 1 is provided with a substrate 2, a wiring portion 3, a light emitting element 4, a first connection portion 5, a second connection portion 6, a soldering portion 7, and a feeding portion 8.

The substrate 2 is formed into a plate shape and is provided with the wiring portion 3 on the surface thereof.

There is no particular limit to a material and a structure of the substrate 2. For example, the substrate 2 can be formed of an inorganic material (ceramics) such as aluminum oxide or aluminum nitride, or an organic material such as paper phenol or glass epoxy. In addition, the substrate 2 may be formed by coating a surface of a metallic plate with an insulator. Meanwhile, if the surface of the metallic plate is coated with the insulator, the insulator may be formed of the organic material or the inorganic material.

Here, if a heating value of the light emitting element 4 is high, it is preferable that the substrate 2 is formed by using a material having high thermal conductivity in terms of the heat dissipation. Examples of the material having the high thermal conductivity are, for example, the ceramics such as the aluminum oxide or the aluminum nitride, a heat conductive resin, or a metallic plate of which a surface is coated with an insulator.

In addition, the substrate 2 may be one plate-like body or may be a plurality of divided plate-like bodies. Further, the substrate 2 may be a single layer or may be a multilayer.

The wiring portion 3 is provided on at least one surface of the substrate 2. The wiring portion 3 can be assumed to be, for example, a wiring pattern.

In this case, the wiring portion 3 can be provided on both surfaces of the substrate 2, but, in order to reduce manufacturing cost, is preferably provided on one surface of the substrate 2. The light emitting element 4 is provided on the substrate 2, and is electrically connected to the wiring portion 3. If the wiring portion 3 is the wiring pattern, the light emitting element 4 can be mounted on the wiring pattern. In addition, a circuit component (not shown) such as a capacitor or a resistor may be electrically connected to the wiring portion 3.

A method of connecting the light emitting element 4 or the circuit component (not shown) is not particularly limited. For example, the light emitting element 4 or the circuit component may be mounted through flip chip, may be mounted through a wire bonding method, or may be joined through the soldering.

The light emitting element 4 can be a so-called spontaneous light emitting element, for example, a light emitting diode, an organic light emitting diode, and a laser diode.

A radiation surface of the light emitting element 4 faces the front side of the light emitting device 1, and light is mainly radiated toward the front side of the light emitting device 1. The number of the light emitting elements 4 is not particularly limited, and one or more of the light emitting elements 4 may be provided depending on a use of the light emitting device 1 or the size of the light emitting element 4. If a plurality of the light emitting elements 4 are provided, a regular form of arrangement such as a linear pattern, a matrix pattern, a zigzag pattern, and a radial pattern, can be employed or an optional form of arrangement can be also employed.

The first connection portion 5 is provided on the substrate 2 and is electrically connected to the wiring portion 3.

Figure 2A:
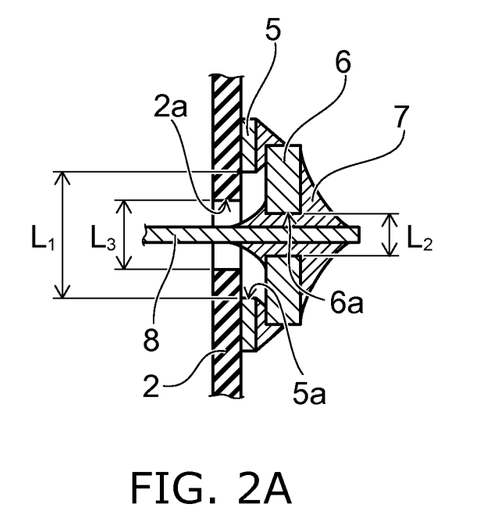
FIGS. 2A and 2B are diagrams schematically illustrating a first connection portion 5, a second connection portion 6, and a soldering portion 7.
Figure 2B:
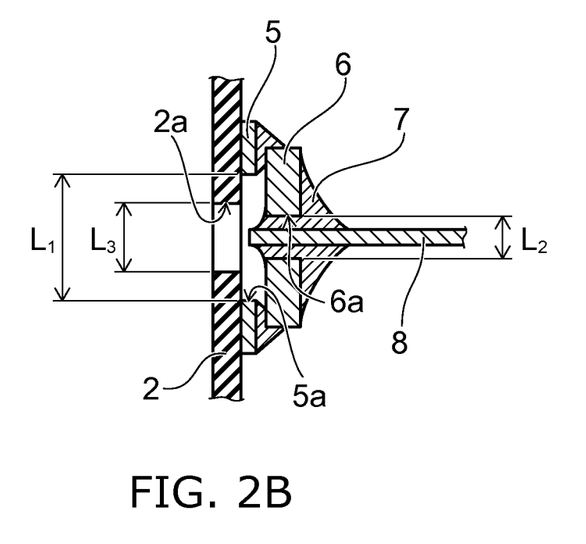

The first connection portion 5 includes an opening portion 5a (corresponding to an example of the second opening portion) (refer to FIG. 2).

A dimension $L_1$ of the opening portion 5a is larger than a dimension $L_3$ of the hole (a through hole) 2a which passes through the substrate 2 in the thickness direction.

The first connection portion 5 can be, for example, a land which is provided in the periphery of the hole 2a.

Note that, as will be described later, if the hole 2a is not provided, the opening portion 5a is not necessarily required. If the opening portion 5a is not provided, the first connection portion 5 can be, for example, a pad which is provided at a predetermined position of the substrate 2.

In addition, for example, the land can be formed into a ring shape and the pad can be formed into a circle, but shapes thereof are not limited. It is possible to properly change the shape of the land or the pad.

The second connection portion 6 is joined to the first connection portion 5 through the soldering.

The second connection portion 6 is joined to the first connection portion 5 through the soldering, and includes the opening portion 6a (corresponding to an example of the first opening portion) to which the feeding portion 8 is inserted.

The soldering portion 7 is provided between the opening portion 6a and the feeding portion 8. The soldering portion 7 is formed by joining the second connection portion 6 and the feeding portion 8 through soldering.

Meanwhile, descriptions of the first connection portion 5, the second connection portion 6, and the soldering portion 7 will be made later in detail.

The electric power is supplied to the feeding portion 8 from the outside.

The feeding portion 8 extends in the inside of a socket 10 in the forward and backward direction.

As illustrated in FIG. 1A, the feeding portion 8 projects forward from the surface of the substrate 2. In addition, as illustrated in FIG. 1B, the feeding portion 8 projects rearward on the inside of a connector inserting portion 10c which is provided in the socket 10.

The feeding portion 8 is electrically connected to a connector (not shown) which is inserted from the rear side of the socket 10, and to which the electric power is supplied from the outside. For this reason, it is possible to supply the electric power to the light emitting element 4 through the feeding portion 8, the first connection portion 5, the second connection portion 6, and the soldering portion 7.

Note that the configuration of the feeding portion 8 is not limited to the above description. For example, the number of the feeding portions 8 may be three or more without being limited to two. In addition, a cross sectional shape of the feeding portion 8 may be a circle or the like without limiting to a rectangle.

A material of the feeding portion 8 is not particularly limited as long as it is an electrically conducting material. The material of the feeding portion 8 can be, for example, a copper alloy.

In addition, the light emitting device 1 can be provided with a reflector 9.

The reflector 9 is provided to surround the light emitting elements 4.

The reflector 9 is formed into, for example, a ring shape, and is formed to expose the light emitting element 4 to a center portion 9a.

The reflector 9 can be formed of, for example, resin or ceramics.

A wall surface of the center portion 9a of the reflector 9 is formed into an inclined surface. A part of light radiated from the light emitting element 4 is reflected in the wall surface of the center portion 9a of the reflector 9 and is irradiated toward the front side of the light emitting device 1. Meanwhile, the configuration of the reflector 9 can be properly changed without being limited to the above description.

In addition, the center portion 9a of the reflector 9 can be filled with a resin. Examples of the resin with which the center portion 9a of the reflector 9 is filled include a silicone resin and the like. When the center portion 9a of the reflector 9 is filled with the resin, it is possible to suppress the mechanical contact from the outside with respect to the light emitting element 4 or the like, and the air and moisture attaching to the light emitting element 4 or the like. For this reason, it is possible to improve the reliability with respect to light emitting device 1.

Further, the resin with which the center portion 9a of the reflector 9 is filled can include a phosphor. The phosphor can be, for example, a YAG phosphor (yttrium-aluminum-garnet phosphor-based). If the light emitting element 4 is a blue light emitting diode and the phosphor is the YAG phosphor, the YAG phosphor is excited by the blue light emitted from the light emitting element 4, and a yellow fluorescence is radiated from the YAG phosphor. Then, due to the blue light and the yellow light which are mixed to each other, white light is emitted from the light emitting device 1. Meanwhile, types of the phosphors and the light emitting element 4 are not limited to the above description, and it is possible to properly change types thereof depending of the use of the light emitting device 1 so as to obtain a desired emission color.

In addition, the light emitting device 1 can be provided with the socket 10.

The socket 10 can hold, for example, the substrate 2 or have the feeding portion 8 built therein. In addition, as illustrated in FIGS. 1A and 1B, the socket 10 may have a structure in which a resin portion 10a and a heat dissipation member (heat sink) 10b are combined with each other. Alternatively, the socket 10 may have a structure formed by either of the resin portion 10a and the heat dissipation member 10b.

The substrate 2 may be fixed to the front surface of the socket 10 by using an adhesive, a double sided tape, or the like, or may be fixed to the front surface of the socket 10 by using a fastening member such as a screw or the like. In addition, the substrate 2 may be fixed to the front surface of the socket 10 by using an elastic member such as the spring.

Next, descriptions pertaining to the first connection portion 5, the second connection portion 6, and the soldering portion 7 will be made. FIG. 2 is a diagram schematically illustrating the first connection portion 5, the second connection portion 6, and the soldering portion 7.

Meanwhile, FIG. 2A illustrates a case where the feeding portion 8 is inserted into the first connection portion 5 and the second connection portion 6, and FIG. 2B illustrates a case where the feeding portion 8 is inserted into the second connection portion 6.

Figure 3A:
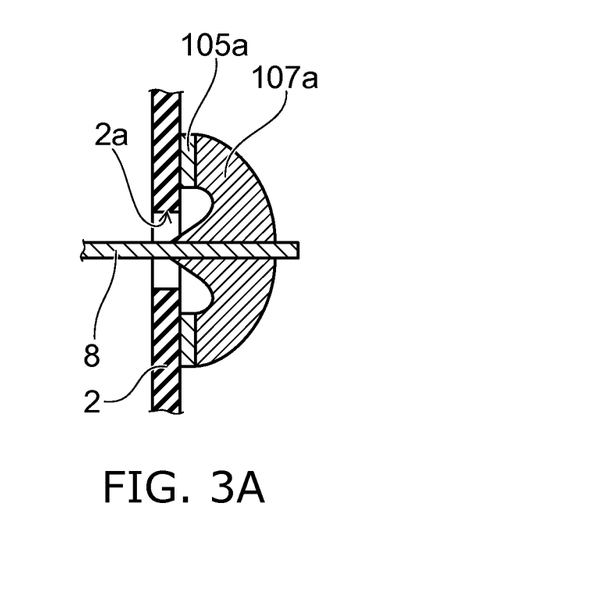
FIGS. 3A and 3B are diagrams schematically illustrating connection portions 105a and 105b according to a comparative example.
Figure 3B:
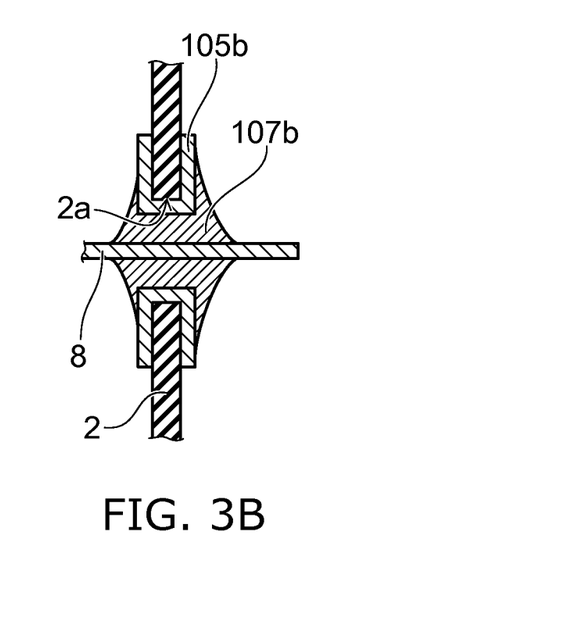

FIG. 3 is a diagram schematically illustrating connection portions 105a and 105b according to a comparative example.

Meanwhile, FIG. 3A illustrates a case of the connection portion 105a which is provided on one surface of the substrate 2, and FIG. 3B illustrates a case of the connection portion 105b which is provided in the inside of the hole 2a passing through the substrate 2 in the thickness direction and in the periphery of the hole 2a.

First, description pertaining to the connection portions 105a and 105b according to the comparative example illustrated in FIG. 3 will be made. Pertaining to the light emitting device 1 which is provided with the light emitting elements 4, the reduction in size is desired so as to realize the reduction in material, the reduction in weight, or the like. In addition, the realization of high quality and low cost of the light emitting device 1 is also desired.

In this case, it is possible to realize the low cost by reducing the area of the substrate 2 and providing the wiring portion 3 on one surface of the substrate 2 (a single-sided wiring).

If the wiring portion 3 is provided on one surface of the substrate 2, generally, the connection portion (the land) 105a is provided at a position which is far away, by a certain distance, from the periphery of the hole 2a which passes through the substrate 2 in the thickness direction, as illustrated in FIG. 3A.

However, when providing such a connection portion 105a, the distance between the connection portion 105a and the feeding portion 8 becomes longer. For this reason, when joining the connection portion 105a and the feeding portion 8 through the soldering, a soldering portion 107a is likely to be formed into a bridge shape. When the soldering portion 107a is formed into the bridge shape, the shape of the soldering portion 107a becomes unstable in a process of solder-joint, and thereby a defect such as a hole is liable to be generated in a portion of the soldering portion 107a. Thus, if the defect is generated in the soldering portion 107a, there is a concern in that the soldering portion 107a is not sufficiently strong with respect to the thermal shock, an external force, or the like.

In contrast, as illustrated in FIG. 3B, when the connection portion 105b is provided in the inside of the hole 2a which passes through the substrate 2 in the thickness direction and in the periphery of the hole 2a, that is, both surfaces of the substrate 2, it is possible to shorten the distance between the connection portion 105b and the feeding portion 8. For this reason, when joining the connection portion 105b and the feeding portion 8 through the soldering, the solder is likely to spread to the connection portion 105b and the feeding portion 8, and thus a normal fillet is easily formed. For this reason, the strength and reliability in a soldering portion 107b can be improved.

However, since it is necessary to provide the connection portion 105b in the inside of the hole 2a and the surface of the substrate 2 on which the wiring portion 3 is not provided, there is a concern in that the manufacturing cost of the substrate 2 becomes 1.5 times to 2 times.

Next, returning to FIG. 2, description pertaining to the first connection portion 5 and the second connection portion 6 will be made.

As illustrated in FIGS. 2A and 2B, the first connection portion 5 is provided at a position which is far away, by a certain distance, from the periphery of the hole 2a which passes through the substrate 2 in the thickness direction.

In this case, in a case of a diagram illustrated in FIG. 2A, the hole 2a is provided to insert the feeding portion 8 thereinto. For this reason, in a case of the diagram illustrated in FIG. 2A, the first connection portion 5 can be the ring-shaped land or the like which is provided in the periphery of the hole 2a.

On the other hand, in a case of a diagram illustrated in FIG. 2B, the hole 2a is not necessarily provided to insert the feeding portion 8 thereinto. However, if the hole 2a is provided, the positioning of the feeding portion 8 when joining the feeding portion 8 through the soldering, and inspection of the soldering portion 7 on the substrate 2 side are easily performed.

For this reason, in a case of a diagram illustrated in FIG. 2B, if the hole 2a is provided, the first connection portion 5 can be the ring-shaped land or the like which is provided in the periphery of the hole 2a. In addition, if the hole 2a is not provided, the first connection portion 5 can be the circular pad or the ring-shaped land which is provided at a predetermined position.

The first connection portion 5 is formed of the conducting material, and is electrically connected to the wiring portion 3. The first connection portion 5 and the wiring portion 3 may be formed at the same time.

The second connection portion 6 is joined to the first connection portion 5 through the soldering.

The second connection portion 6 is formed into a plate shape, and includes the opening portion 6a into which the feeding portion 8 is inserted.

Then, the dimension $L_2$ of the opening portion 6a of the second connection portion 6 is smaller than the dimension $L_1$ of the opening portion 5a of the first connection portion 5.

For this reason, as illustrated in FIGS. 2A and 2B, the distance between the first connection portion 5 and the feeding portion 8 becomes longer, but it is possible to shorten the distance between the second connection portion 6 and the feeding portion 8.

In this case, the feeding portion 8 is joined to the second connection portion 6 through the soldering. For this reason, if the second connection portion 6 and the feeding portion 8 are joined to each other through the soldering, the solder is likely to spread to the second connection portion 6 and the feeding portion 8, and thus a normal fillet is easily formed. As a result, the strength and reliability in the soldering portion 7 can be improved.

In addition, as illustrated in FIG. 3B, the first connection portion 5 is not necessarily provided in the inside of the hole 2a and on the surface of the substrate 2 on which the wiring portion 3 is not provided. That is, the first connection portion 5 may be provided on the surface of the substrate 2 on which the wiring portion 3 is provided. For this reason, it is possible to suppress the manufacturing cost of the substrate 2.

Figure 4A:
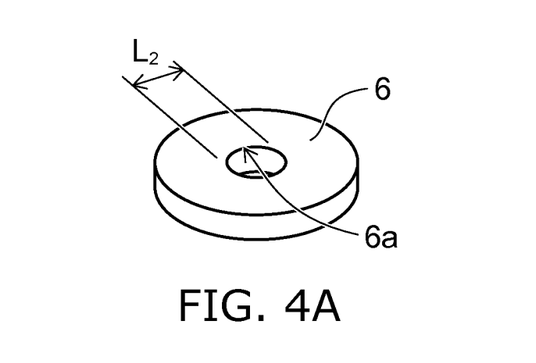
Figure 4B:
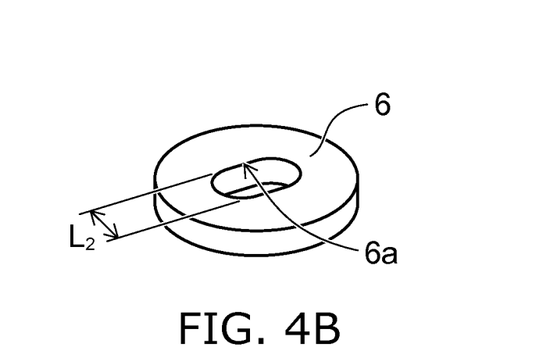
Figure 4C:
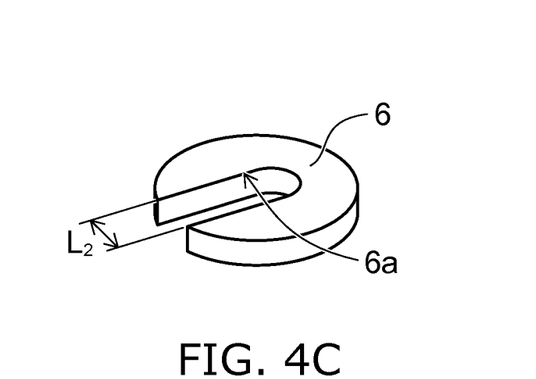

FIGS. 4A to 4C are diagrams schematically illustrating a configuration of the opening portion 6a.

As illustrated in FIG. 4A, the opening portion 6a can be the hole which passes through the second connection portion 6 in the thickness direction. In this case, the dimension $L_2$ of the opening portion 6a can be the smallest in the dimensions of the cross section of the opening portion 6a. For example, if the cross section of the opening portion 6a is a circle, the dimension $L_2$ can be a diameter of the opening portion 6a. If the cross section of the opening portion 6a is a square, the dimension $L_2$ can be the length of one side of the opening portion 6a.

As illustrated in FIG. 4B, the opening portion 6a can be a slit which passes through the second connection portion 6 in the thickness direction. In this case, the dimension $L_2$ of the opening portion 6a can be the smallest in the dimensions of the cross section of the opening portion 6a. For example, as illustrated in FIG. 4B, the dimension $L_2$ of the opening portion 6a can be a dimension of the width of the slit.

As illustrated in FIG. 4C, the opening portion 6a can be a slit which passes through the second connection portion 6 in the thickness direction, and one end of which opens toward the periphery of the second connection portion 6. In this case, the dimension $L_2$ of the opening portion 6a can be the smallest in the dimensions of the cross section of the opening portion 6a. For example, as illustrated in FIG. 4C, the dimension $L_2$ of the opening portion 6a can be a dimension of the width of the slit.

A material of the second connection portion 6 is not particularly limited as long as it is an electrically conducting material. The material of the second connection portion 6 can be, for example, a copper alloy such as phosphor bronze. In consideration of wettability of the solder when performing solder-joint, it is possible to provide a film, which is formed of tin or the like, on the surface of the second connection portion 6. For example, it is possible to provide a film formed of tin or the like on the surface of the second connection portion 6 through plating.

Next, a process of soldering will be exemplified.

First, the second connection portion 6 is joined to the first connection portion 5 which is provided on the surface of the substrate 2 through the soldering.

For example, the surface of first connection portion 5 is coated with paste-like solder, and the second connection portion 6 is mounted on the paste-like solder. Then, the second connection portion 6 is joined onto the first connection portion 5 through the soldering, that is, by heating the paste-like solder by a reflow oven.

Next, the feeding portion 8 is joined to the second connection portion 6 through the soldering.

For example, it is possible to join the feeding portion 8 to the second connection portion 6 through the soldering by inserting the feeding portion 8 into the opening portion 6a of the second connection portion 6.

In addition, the first connection portion 5, the second connection portion 6, and the feeding portion 8 can be joined to each other through the soldering at the same time.

For example, the first connection portion 5 and the second connection portion 6 can be coated with the paste-like solder, and then the feeding portion 8 can be inserted into the opening portion 6a of the second connection portion 6. Then, the first connection portion 5, the second connection portion 6, and the feeding portion 8 can be joined to each other at the same time through the soldering, that is, by heating the paste-like solder by a reflow oven.

Figure 5:
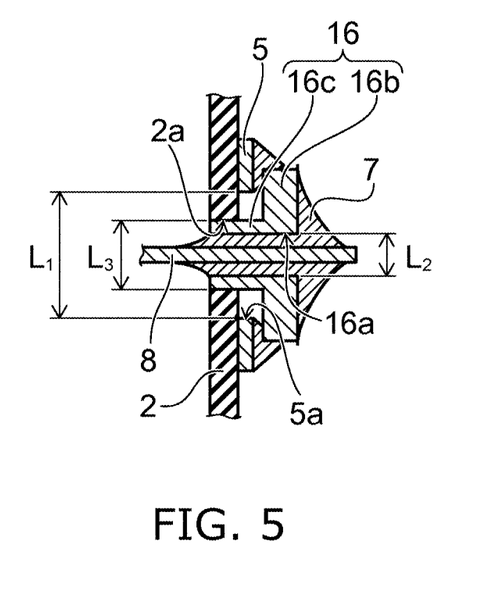
FIG. 5 is a diagram schematically illustrating a second connection portion 16 according to another embodiment.

FIG. 5 is a diagram schematically illustrating a second connection portion 16 according to another embodiment. As illustrated in FIG. 5, the second connection portion 16 is joined to the first connection portion 5 through the soldering.

The second connection portion 16 includes a base portion 16b (corresponding to an example of the first base portion) which is formed into a plate shape and a projection portion 16c which projects toward the substrate 2 from one end surface of the base portion 16b. In addition, the second connection portion 16 includes an opening portion 16a (corresponding to an example of the first opening portion) passes through the base portion 16b and the projection portion 16c in the thickness direction. The opening portion 16a is configured to insert the feeding portion 8 thereinto. Meanwhile, the configuration of the opening portion 16a can be, for example, the same as that of the opening portion 6a as illustrated in FIGS. 4A to 4C.

In addition, the projection portion 16c is configured to be inserted into the inside of the hole 2a of the substrate 2. For this reason, it is possible to join the first connection portion 5 and the second connection portion 16 through the soldering in a state in which the projection portion 16c is inserted into the inside of the hole 2a of the substrate 2. If it is possible to join the first connection portion 5 and the second connection portion 16 through the soldering in a state in which the projection portion 16c is inserted into the inside of the hole 2a of the substrate 2, the positional relationship between the first connection portion 5 and the second connection portion 16 is not deviated even when the solder is melted. For this reason, it is possible to make the state of the soldering portion 7 stable.

Further, the dimension $L_2$ of the opening portion 16a of the second connection portion 16 is smaller than the dimension $L_1$ of the opening portion 5a of the first connection portion 5.

For this reason, as described above, when joining the second connection portion 16 and the feeding portion 8 through the soldering, the solder is likely to spread to the second connection portion 16 and the feeding portion 8, and thus a normal fillet is easily formed. As a result, the strength and reliability in the soldering portion 7 can be improved.

In addition, the first connection portion 5 may be provided on the surface of the substrate 2 on which the wiring portion 3 is provided, and thus it is possible to suppress an increase in the manufacturing cost of the substrate 2.

Note that the process of solder-joint can be the same as that described above.

Figure 6A:
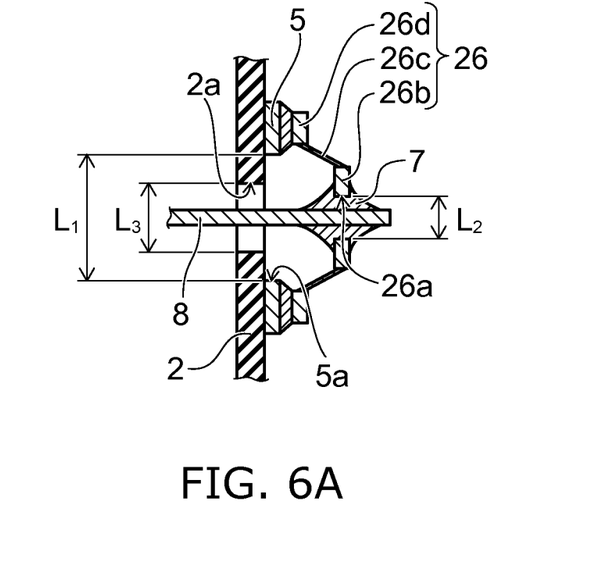
FIGS. 6A and 6B are diagrams schematically illustrating a second connection portion 26 according to still another embodiment.
Figure 6B:
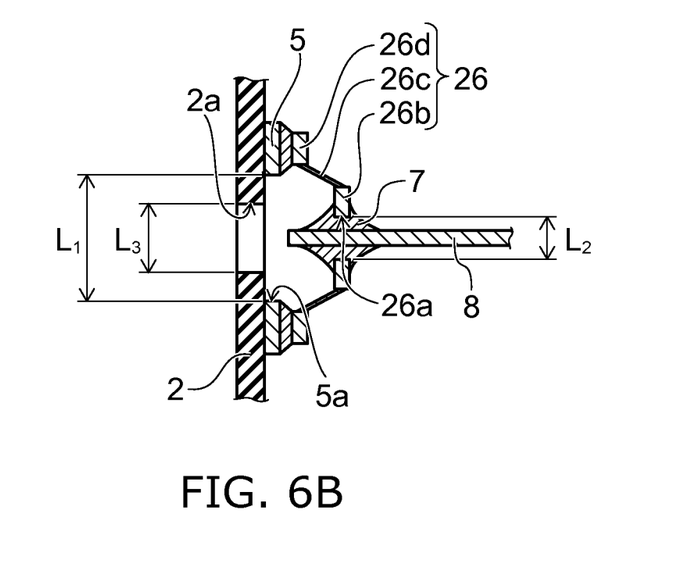

FIG. 6 is a diagram schematically illustrating a second connection portion 26 according to still another embodiment. Meanwhile, FIG. 6A illustrates a case where the feeding portion 8 is inserted into the first connection portion 5 and the second connection portion 26, and FIG. 6B illustrates a case where the feeding portion 8 is inserted into the second connection portion 26. As illustrated in FIGS. 6A and 6B, the second connection portion 26 is joined to the first connection portion 5 through the soldering.

The second connection portion 26 includes a base portion 26b (corresponding to an example of the first base portion) which is formed into a plate shape, a projection portion 26c which projects toward the substrate 2 from the base portion 26b, and a base portion 26d (corresponding to an example of the second base portion) which is provided on the projection portion 26c on the side opposite to the side on which the base portion 26b is provided. The base portion 26d is formed into a plate shape, and is substantially in parallel with the base portion 26b. In addition, the base portion 26d projects toward the outside of the second connection portion 26. The base portion 26d is joined to the first connection portion 5 through the soldering. When the base portion 26d is provided, it is possible to improve the strength of the joining the base portion 26d and the first connection portion 5 through the soldering.

In addition, the second connection portion 26 includes an opening portion 26a (corresponding to an example of the first opening portion) which passes through the base portion 26b in the thickness direction. The opening portion 26a is configured to insert the feeding portion 8 thereinto. Meanwhile, the configuration of the opening portion 26a can be, for example, the same as that of the opening portion 6a as illustrated in FIGS. 4A to 4C.

Here, as described above, if the heating value of the light emitting element 4 is high like the light emitting diode, the substrate 2 is formed by using the material having the high thermal conductivity. If the substrate 2 is formed of the material having the high thermal conductivity, when joining the feeding portion 8 through the soldering, the heat is likely to be dissipated to the substrate 2. For this reason, it is difficult to perform the solder-joint. In addition, if the heat is transferred to the substrate 2 when joining the feeding portion 8 through the soldering, there is a concern in that the mounted light emitting element 4 or the like is adversely affected by the heat.

In the present embodiment, the feeding portion 8 is joined to the base portion 26b through the soldering. For this reason, it is possible to elongate the distance between a position where the feeding portion 8 is joined through soldering and the substrate 2 as compared with a case illustrated in FIGS. 3A and 3B. As a result, when joining the feeding portion 8 through the soldering, it is possible to suppress heat dissipation to the substrate 2. Accordingly, it is possible to realize the facilitation of the solder-joint, the reduction of the influence of the mounted light emitting element 4, or the like. For example, it is possible to efficiently perform the solder-joint in a short time. Alternatively, it is possible to perform the solder-joint at a low temperature, and thus thermal damage to the substrate 2, the light emitting element 4, and the like can be reduced.

In addition, the dimension $L_2$ of the opening portion 16a of the base portion 26b is smaller than the dimension $L_1$ of the opening portion 5a of the first connection portion 5.

For this reason, as described above, when joining the base portion 26b and the feeding portion 8 through the soldering, the solder is likely to spread to the base portion 26b and the feeding portion 8, and thus a normal fillet is easily formed. As a result, the strength and reliability in the soldering portion 7 can be improved.

In addition, since the first connection portion 5 may be provided on the surface of the substrate 2 on the side on which the wiring portion 3 is provided, it is possible to suppress the increase in the manufacturing cost of the substrate 2.

Note that the process of solder-joint can be the same as that described above.

Figure 7A:
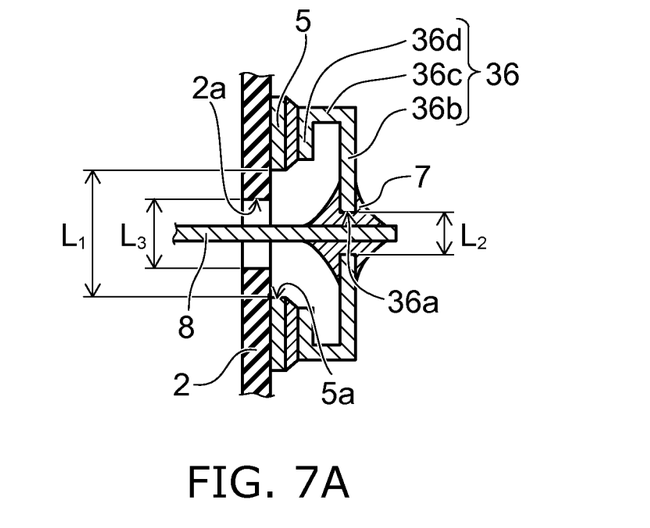
FIGS. 7A and 7B are diagrams schematically illustrating a second connection portion 36 according to still another embodiment.
Figure 7B:
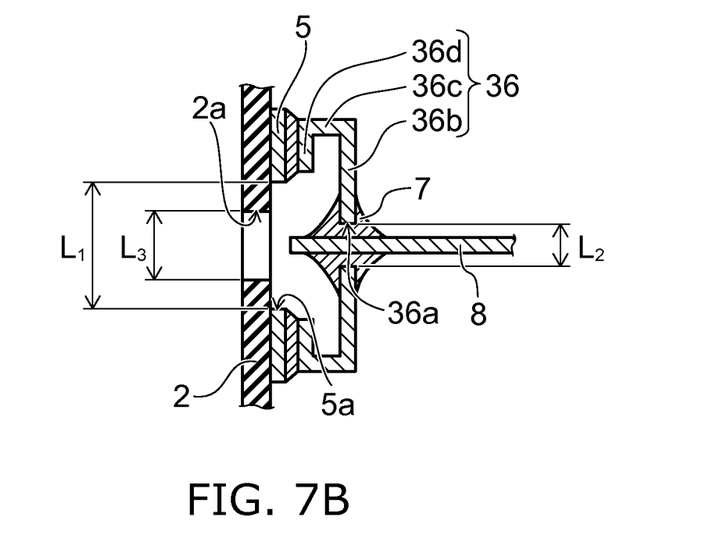

FIG. 7 is a diagram schematically illustrating the second connection portion 36 according to still another embodiment. Meanwhile, FIG. 7A illustrates a case where the feeding portion 8 is inserted into the first connection portion 5 and the second connection portion 36, and FIG. 7B illustrates a case where the feeding portion 8 is inserted into the second connection portion 36. As illustrated in FIGS. 7A and 7B, the second connection portion 36 is joined to the first connection portion 5 through the soldering.

The second connection portion 36 includes a base portion 36b (corresponding to an example of the first base portion) which is formed into a plate shape, a projection portion 36c which projects toward the substrate 2 from the base portion 36*b*, and a base portion 36*d* (corresponding to an example of the second base portion) which is provided on the projection portion 36*c* on the side opposite to the side on which the base portion 36*b* is provided. The base portion 36*d* is formed into a plate shape, and is substantially parallel with the base portion 36*b*. In addition, the base portion 36*d* projects toward the inside of the second connection portion 36. The base portion 36*d* is joined to the first connection portion 5 through the soldering. When the base portion 36*d* is provided, it is possible to improve the strength of the joining the base portion 36*d* and the first connection portion 5 through the soldering.

In addition, the second connection portion 36 includes an opening portion 36*a* (corresponding to an example of the first opening portion) which passes through the base portion 36*b* in the thickness direction. The opening portion 36*a* is configured to insert the feeding portion 8 thereinto. Meanwhile, the configuration of the opening portion 36*a* can be, for example, the same as that of the opening portion 6*a* as illustrated in FIGS. 4A to 4C.

In the present embodiment, since the base portion 36*d* projects toward the inside of the second connection portion 36, it is possible to realize the reduction in size of the second connection portion 36. In addition, it is possible to make a mounted area in the substrate 2 small in size due to the reduction in size of the second connection portion 36, and therefore, it is possible to realize the reduction in size of the light emitting device 1.

In addition, similar to the case of the second connection portion 26 as described above, it is possible to suppress heat dissipation to the substrate 2 when joining the feeding portion 8 through the soldering, the strength and reliability in the soldering portion 7 can be improved since a normal fillet is easily formed, and it is possible to suppress an increase in the manufacturing cost of the substrate 2.

Note that the process of solder-joint can be the same as that described above.

Figures 8A, 8B:
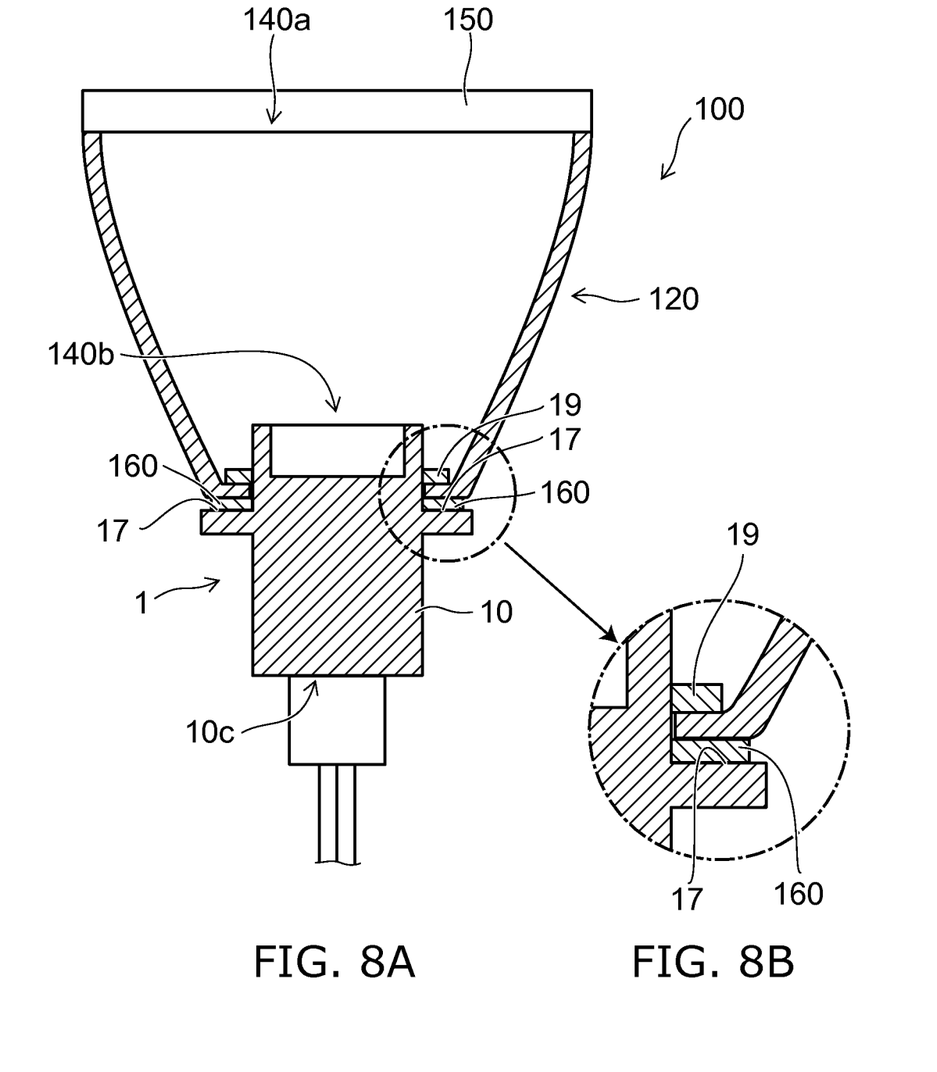
FIGS. 8A and 8B are diagrams schematically illustrating a lighting tool for vehicle 100 which is provided with the light emitting device 1 according to the present embodiment.

FIG. 8 is a diagram schematically illustrating a lighting tool for vehicle 100 which is provided with the light emitting device 1 according to the present embodiment.

Meanwhile, FIG. 8A is a cross-sectional view schematically illustrating the lighting tool for vehicle 100. FIG. 8B is an enlarged view schematically illustrating an engagement portion of the light emitting device 1 and the lighting tool for vehicle 100.

The lighting tool for vehicle 100 includes a reflector 120, a lens 150, and the light emitting device 1.

The appearance of the reflector 120 is substantially formed into a circular truncated cone shape and has a space therein. An inner surface of the reflector 120 is formed into an inclined surface, and the light emitted from the light emitting device 1 is reflected in the inclined surface.

The lens 150 is provided to block an opening 140*a* having a large cross-sectional area in the reflector 120.

The light emitting device 1 is provided to block an opening 140*b* having a small cross-sectional area in the reflector 120.

The light which is emitted from the light emitting device 1 is directly emitted to the outside via the lens 150, or the light is reflected in the inner surface of the reflector 120 and then emitted to the outside via the lens 150.

The lighting tool for vehicle 100 can be, for example, provided in a taillight portion of a vehicle or the like.

A portion, which is formed in the socket 10 of the light emitting device 1 and on the front side from a flange portion 17, is in a state of being surrounded by the reflector 120 and the lens 150. In this case, it is possible to closely adhere the light emitting device 1 and the reflector 120 to each other so as to prevent water from entering. For example, if necessary, a seal 160 which is formed of a material such as rubber or silicone can be provided between the light emitting device 1 and the reflector 120.

Note that, as illustrated in FIG. 8B, the light emitting device 1 and the lighting tool for vehicle 100 may be firmly engaged with each other by providing an engagement projection 19 on the light emitting device 1. In addition, an engagement opening (not shown) corresponding to the engagement projection 19 may be provided in the lighting tool for vehicle 100. Further, an engagement unit (not shown) which is formed of an elastic body or the like may be provided in the lighting tool for vehicle 100. That is, a unit configured to firmly engage the light emitting device 1 and the lighting tool for vehicle 100 with each other can be properly provided.

As above, embodiments are given of the present invention, but these embodiments are described as examples, and thus are not intended to limit the scope of the invention. These novel embodiments described herein may be implemented in various other forms and it is possible to perform various omissions, substitutions, and changes without departing from the scope of the invention. These embodiments and modification examples thereof are within the scope and the gist of the invention and within the scope of its equivalents as the inventions described in claims. In addition, the above described embodiments can be implemented in combination with each other.

The invention claimed is:

1. A light emitting device comprising:
a substrate on which a wiring portion is provided;
a light emitting element which is provided on the substrate and is electrically connected to the wiring portion;
a feeding portion to which an electric power is supplied from the outside;
a first connection portion which is provided on the substrate and is electrically connected to the wiring portion;
a second connection portion which is joined to the first connection portion through soldering and includes a first opening portion into which the feeding portion is inserted; and
a soldering portion which is provided between the first opening portion and the feeding portion.

2. The device according to claim 1,
wherein the first connection portion includes a second opening portion, and
wherein the first opening portion is smaller than the second opening portion.

3. The device according to claim 1,
wherein the second connection portion includes a first base portion and a projection portion which projects toward the substrate from the first base portion, and
wherein the first opening portion passes through the first base portion and the projection portion in the thickness direction.

4. The device according to claim 3,
wherein the projection portion is inserted into a hole which is provided in the substrate.

5. The device according to claim 1,
wherein the second connection portion includes a first base portion, a projection portion which projects toward the substrate from the first base portion, and a second base portion which is provided on the projection portion on the side opposite to the side on which the first base portion is provided, wherein the second base portion projects toward the outside of the second connection portion, and wherein the first opening portion passes through the first base portion in the thickness direction.

6. The device according to claim 1, wherein the second connection portion includes a first base portion, a projection portion which projects toward the substrate from the first base portion, and a second base portion which is provided on the projection portion on the side opposite to the side on which the first base portion is provided, wherein the second base portion projects toward the inside of the second connection portion, and wherein the first opening portion passes through the first base portion in the thickness direction.

* * * * *